United States Patent [19]

Yoldas et al.

[11] 4,251,285
[45] Feb. 17, 1981

[54] DIFFUSION OF DOPANT FROM OPTICAL COATING AND SINGLE STEP FORMATION OF PN JUNCTION IN SILICON SOLAR CELL AND COATING THEREON

[75] Inventors: Bulent E. Yoldas; Lubomyra A. Yoldas, both of Churchill, Pa.

[73] Assignee: Westinghouse Electric Corp., Pittsburgh, Pa.

[21] Appl. No.: 66,368

[22] Filed: Aug. 14, 1979

[51] Int. Cl.³ .................. H01L 21/225; H01L 31/04
[52] U.S. Cl. .................................. 136/256; 136/261; 148/188; 148/190; 252/950; 357/30; 357/52
[58] Field of Search .................. 136/89 CC, 89 SG; 148/188, 190; 252/950; 357/30, 52

[56] References Cited

U.S. PATENT DOCUMENTS 4,101,351 7/1978 Shah et al. ..................... 148/188

OTHER PUBLICATIONS

A. D. Haigh, "Fired Through Printed Contacts on Antireflection Coated Silicon Terrestrial Solar Cells," Conf. Record, 12th IEEE Photovoltaic Specialists Conf., (1976), pp. 360–361.
W. Luft, "Status of TiOx Antireflective Coating in the U.S.," Conf. Record 10th IEEE Photovoltaic Specialists Conf., (1973), pp. 174–179.

Primary Examiner—Aaron Weisstuch
Attorney, Agent, or Firm—R. D. Fuerle

[57] ABSTRACT

The PN juncture in a silicon chip and an oxide coating on its surface are simultaneously formed from clear solution derived from titanium alkoxides, water, alcohol, a suitable acid, and a P or N dopant compound by partial hydrolysis and polymerization. The solution is applied to the surface of a silicon chip. The chip is then heated which converts the solution to a solid oxide coating which meets the antireflective optical film requirements and induces the migration of the dopants into the chip, forming a PN junction in the chip. The method also provides deep and uniform junction formation or diffusion without resulting in excessive carrier concentration.

20 Claims, 8 Drawing Figures

DIFFUSION OF DOPANT FROM OPTICAL COATING AND SINGLE STEP FORMATION OF PN JUNCTION IN SILICON SOLAR CELL AND COATING THEREON

BACKGROUND OF THE INVENTION

In the conventional preparation of a photovoltaic solar cell a PN junction is formed by diffusing either boron or phosphorus into a silicon base material. The silicon base material may be obtained pre-doped so that it is either P type or N type and the opposite type dopant is used in the junction formation process. These diffusions are generally made from a vapor phase in a vacuum or in a non-oxidizing atmosphere such as nitrogen or argon as a carrier gas at temperatures of 850° C. to 1100° C.

In making the solar cells a separate step is needed to apply a quarter-wave optical thickness antireflective film to the surface of the cell to make it more efficient. The antireflective coating increases the efficiency of the cell, for example, as much as 50 percent. Such optical coatings are applied by vacuum deposition, sputtering, or other techniques. Recently it was discovered that polymerized titanium dioxide solutions could be made which would deposit optical coatings of the desired thickness and index of refraction by liquid application methods. See U.S. patent application Ser. No. 931,346 filed Aug. 8, 1978 by Bulent E. Yoldas titled "Polymerized Solutions for Depositing Optical Oxide Coatings," now abandoned in favor of continuation application Ser. No. 065,706, filed Aug. 10, 1979. This new method reduced the cost of the anti-reflective application for solar cells.

SUMMARY OF THE INVENTION

We have discovered that if the anti-reflective coating described in U.S. Patent application Ser. No. 931,346 is doped with a dopant compound, e.g., a boron compound, the dopant atom (boron) will diffuse into the silicon forming a P/N junction during the baking of the antireflective coating. Thus, in a single step, the antireflective coating and the P/N junction is simultaneously formed. This eliminates the expensive procedures of diffusing the dopant into the silicon, and numerous other steps related to masking, cleaning, etc. of the substrate, associated with the present methods of diffusion and junction formation. Quite unexpectedly, we have also found that the concentration of the dopant in the silicon, which is diffused from titania-based optical coating in our new procedure, is in the magnitude of $10^{19}$ carriers per cm$^3$, which is considered to be the ideal concentration for the optimum results. (Previous techniques had produced concentrations of about $10^{20}$ or $10^{22}$.) At these higher concentrations the juncture depth had to be limited to only 0.3 to 0.4 microns in order to avoid recombination of the charges before they crossed the juncture. Because the technique of this invention results in a lower concentration of dopant in the silicon, control of the juncture depth is less critical and juncture depths of one micron or more can be tolerated.

Another advantage of this process is that extremely uniform dopant diffusion and junction depth can be obtained on large devices, photovoltaic or otherwise. This is due to the fact that the diffusion of dopant occurs from an optical film which is homogeneous in composition at the molecular level and uniform in thickness below the wavelength of light. Still another advantage is that multidopant integration and diffusion on well defined areas of a substrate can be obtained in a single step without the need to mask the substrate; this is done by applying solutions only on those areas.

PRIOR ART

U.S. Patent application Ser. No. 931,346 filed Aug. 8, 1978 by Bulent E. Yoldas titled "Polymerized Solutions for Depositing Optical Oxide Coatings," now abandoned in favor of continuation application Ser. No. 065,706, filed Aug. 10, 1979 discloses the preparation and use of the alkoxide solutions for forming oxide coatings. The solutions used in this invention are made by adding a dopant compound to those solutions.

DESCRIPTION OF THE INVENTION

Figure 1:
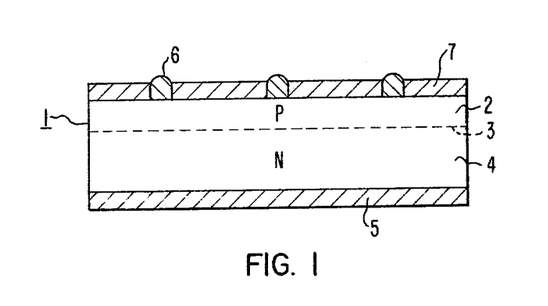
FIG. 1 is a simplified isometric view in section of a certain presently preferred embodiment of a solar cell according to this invention.

In FIG. 1, a silicon wafer 1 is composed of a P layer 2, a P/N junction 3, and an N layer 4 from which electricity is drawn by contacts 5 and 6 attached thereto respectively. On the surface of wafer 1 which is exposed to light is the antireflective coating 7 according to this invention, about ¼ optical wavelength in thickness and having an index of refraction equal to the square-root of the index of refraction of the substrate. The coating reduces the reflection of light back to its source and thereby enhances the efficiency of the solar cell. The captured light causes electrons to move from the P layer to the N layer thereby generating an electric current.

The silicon starting material used in this invention is commercially available in the form of strips, i.e. web silicon, about one-half to one inch in width, and in form of chips about 2 to about 10 centimeters in diameter, though silicon of any dimension can be used. The silicon is commonly about 5 to about 10 mils in thickness. If undoped silicon is used, it is necessary to diffuse a P layer into the silicon from one surface and an N layer from the opposite surface in order to form a P/N juncture. It is preferable to use a silicon material which has been pre-doped with a P or an N dopant throughout because diffusion into this silicon with a dopant of the opposite type forms a P/N juncture in one step. Preferably, silicon which has been doped with phosphorus, that is, an N type silicon, is used because it has been found that the method of this invention works best using boron, which is a P type dopant.

The dopant is diffused into the silicon from a solution derived from metal alkoxides. The precursor solution is a clear titanium oxide based solution, which is derived from partial hydrolysis and polymerization of titanium alkoxides. The preparation of this solution has been presented in detail in the aforesaid patent application Ser. No. 931,346 herein incorporated by reference. Alkoxides useful in preparing the solutions have the general formula M(OR)$_n$. In the formula "M" represents a metal ion. This ion is preferably titanium as it is commercially the most important but it can also be tantalum. In this invention at least 40% of the resulting coating should be titania. The remainder can be up to 25% SiO$_2$, up to 15% of another metal oxide of a metal which forms an alkoxide, or mixtures thereof. These alkoxides can be included in titania to alter the index of refraction of the coating as will be apparent to those skilled in the art. The small "n" in the formula is the valence of the M ion and can vary from 3 to 5. The R group is alkyl from $C_1$ to $C_6$. Each R group may be independently selected if desired though they are usually the same. The R group is preferably ethyl, isopropyl, or butyl because these alkoxides are commercially available and inexpensive. Also, the alcohols which are formed from these alkyl groups mix with water in the range of the invention.

The alcohol used in preparing the coating solution can be any liquid solvent or alcohol, so long as it is dry or its water content is low and well defined and it does not react with alkoxides. Higher alcohols produce thicker films. The alcohol need not be the same alcohol that is produced by the hydrolysis of the alkoxide, and in some instances it is desirable that they be different in order to obtain different viscosities. The amount of alcohol used should be sufficient to produce a solution having a solids content of about 0.1 to about 15% by weight based on equivalent oxide. A greater solids content for the same degree of hydrolysis will cause the solution to gel and a lesser solids content results in undesirably thin coatings. A preferred solids content is about 2 to about 8% by weight based on equivalent oxide. Stated another way, the preferred maximum is about 1 mole alkoxide per liter of final solution.

Metal alkoxides, in general, hydrolyze quite vigorously when brought into contact with water, forming oxides and hydroxides as represented by the reactions.

$$M(OR)_n + nH_2O \rightarrow M(OH)_n + nR(OH) \quad (1)$$

$$M(OR)_n + n/2\ H_2O \rightarrow MO_{n/2} + nROH \quad (2)$$

Whether the oxide or the hydroxide forms during the hydrolysis depends on the nature of the alkoxide. In either case, however, the resultant material is particulate, precipitates out, and therefore is not useful for coating. The alkoxides of titanium and tantalum, particularly, form precipitates even under insufficient water hydrolysis, and the formation of precipitates cannot be prevented under normal conditions. However, U.S. application Ser. No. 931,346 describes a method of preparing soluble intermediate species from these alkoxides which are capable of polymerizing into an continuous oxide network. Precipitate formation and self-condensation which would normally occur during the hydrolysis of these alkoxides are prevented from occurring by a careful control of molecular interaction during they hydrolysis where certain amounts of OR groups are left in the molecular structure. This is done by controlling, first, the amount of water and dilution of the system, and second, by the presence of a critical amount of certain acids.

Because the water and/or alkoxide is diluted by the alcohol, the interaction of alkoxide and water molecules are reduced to a critical minimum where the complete hydrolysis of an alkoxide molecule cannot take place, occurrence of which would precipitate $TiO_2$. The first reaction produces a partially hydrolyzed alkoxide which does not precipitate:

$$Ti(OR)_4 + H_2O \rightarrow Ti(OR)_3OH$$

The partially hydrolyzed alkoxide molecules include $Ti(OR)_2(OH)_2$ and $Ti(OR)(OH)_3$ and can then form a polymer with other alkoxide molecules:

$$(RO)_3Ti-OH + RO-Ti(OR)_3 \rightarrow (RO)_3Ti-O-Ti(OR)_3 + ROH$$

which can again react with other partially hydrolyzed titanium species. Because of the alkyl groups in the polymer it remains soluble in the alcohol. To keep the polymer soluble, it is necessary that not all the alkoxide bonds be hydrolized. Thus, the amount of water added is absolutely critical. If the amount is less than 1.7 moles of water per mole of alkoxide the coatings may be permanently cloudy and if more than 8 moles of water per mole of alkoxide is used, the solution will gel fairly quickly. Preferably the amount of water should be 1.8 to 2.2 moles per mole of alkoxide.

In preparing the solution it is important to avoid contacting alkoxide with water without diluting one or both of them with alcohol first for otherwise a precipitate will form at the point of contact. Although either or both the water and alkoxide can be diluted with alcohol first, it is preferable to dilute the water, then to mix the water-alcohol mixture with the alkoxide. There should be a minimum of 600 cc. of alcohol used per mole of alkoxide; the preferable diluting range, however, is 2 to 8 liters of alcohol per mole of alkoxide.

When water and the alkoxide are brought into contact in an alcohol diluted system, the system turns cloudy. This cloudiness, which indicates the condensation of separate particles, can be avoided by introducing at least 0.014 moles of either $HNO_3$ or HCl acids. If the introduction of acid is made into the water-alcohol solution before mixing with the alkoxide no cloudiness ever occurs, and this is therefore the preferred method of introducing the acid. Acid can be added anytime after the mixing occurs and it will cause the cloudy slurry to turn into a clear solution. However, if more than 0.1 moles of acid are used per mole of alkoxide, the solubility of the solution is reduced and it will turn cloudy after several days. So far, no organic acids have been found which work, and the only inorganic mineral acids which have been found to work are hydrochloric acid and nitric acid, although not all acids have been tried. It was also found that in some systems, such as in glycol, this acid is not required.

The dopant compound may be added directly to the alkoxide solution but preferably a separate solution is prepared which contains the dopant compound. The dopant compound is a compound of a P or N type dopant. The commonest N and P dopants are phosphorus and boron and they are preferred as they are the most efficient, but it may be possible to use other dopants such as aluminum or arsenic. Boron is the most preferred dopant because it has been found to work the best. A solution is prepared of a compound of the dopant such as, for example, an alkoxide or an acid. Alkoxides from $C_1$ to $C_4$ are preferred. These compounds include boron trimethoxide, boron triethoxide, boron triisopropoxide, phosphorus pentabutoxide, phosphorus pentaethoxide, phosphorus pentamethoxide, etc. The three compounds which are particularly preferred are boron trimethoxide, $B(OCH_3)_3$, boric acid, and phosphoric acid. Whatever dopant compound is used, it must be compatible with the alkoxide solution. That is, it must go into the precursor solution either by reaction with the metal alkoxide or by dissolution, but it must not form a precipitate. When the alkoxide solution is baked the dopant atoms, boron or phosphorus, migrate into the silicon to form the P/N juncture. If the dopant is added from an alkoxide it may be partially hydrolyzed with 1.0 to 1.5 moles of water per mole of alkoxide to prevent its vaporization. However, this may not be necessary if the base solution contains enough hydroxyl groups. The remainder of the solution is made up of alcohol. The alcohol concentration in the total solution controls the thickness of the film but it is not especially critical in the dopant solution and the solution of the dopant compound may contain no alcohol or up to 99% alcohol as is desired. The solution of the dopant compound or the dopant compound itself is then mixed with the alkoxide solution. This final solution should contain about 10% to about 30% by weight of dopant compound based on the total weight of the metal alkoxide and the dopant. More than 30% may be used but there is no additional benefit to using more than 20% because it does not increase the concentration of the dopant in the silicon. However, more may be useful in altering the index of refraction of the coating. Less than 10% reduces the dopant concentration in the silicon but this may be desirable under some circumstances.

The solution, once prepared, should be aged for a few hours to permit the polymerization to proceed and stabilization of its viscosity. The solution should be clear at this stage. A clear solution indicates that a single continuous phase has been made rather than a particulate suspension or a precipitate. To make a coating from the solution, the solution is applied to a silicon substrate. Application may be by dipping, spraying, printing, painting, spinning, or other suitable liquid application method, but dipping and spinning are the preferred methods as they are most easily adapted to mass production. Dopant diffusion into silicon from an essentially titania coating is contemplated as within the scope of this invention regardless of how such titania coating is formed; the coating may be formed from other types of solutions or from vapor deposition, even though the preferred method is from the solutions described here. Extremely uniform coatings on large areas, e.g., greater than 100 square centimeters, are readily obtainable, unlike the vapor deposition coating.

For an anti-reflective coating on a solar cell, the substrate is silicon either in the form of wafers or as a continuous strip. The surface of silicon reflects 35–38% of solar energy; since the reflected portion is not available for the conversion process, the overall efficiency is thereby reduced unless an antireflective coating is applied. Antireflective (AR) coatings must be highly transparent and stable in the outdoor environment. The refractive index and thickness of the AR coating must meet optical conditions described by Fresnel's equation to be antireflective in the desired wavelength range. Minimum reflection from a silicon cell can be achieved by using an AR coating that is of quarter wavelength optical thickness, about 750 Å, with an index of refraction of approximately 2.0. Therefore, at the end of the heat treatment, which provides proper boron diffusion and junction depth within the substrate, the coating must meet these optical requirements. Since the coating is affected by this heat-treatment, the initial composition and thickness must be tailored to give the index of refraction 2 and thickness about 750 Å after the heat treatment. If a boron or phosphorus dopant is used a preferred temperature range is about 850° C. to about 1100° C. because at less than 850° C. there is very low diffusion of the boron into the silicon and at more than 1100° C. the silicon begins to deteriorate. A temperature of 900° C. seems to work the best. The firing should be done in a vacuum or under nitrogen or argon or another inert gas to prevent the silicon from oxidizing. The film resulting after the heat treatment is continuous, has a uniform thickness within several angstroms, and is tenaciously bounded onto the substrate.

Figure 2:
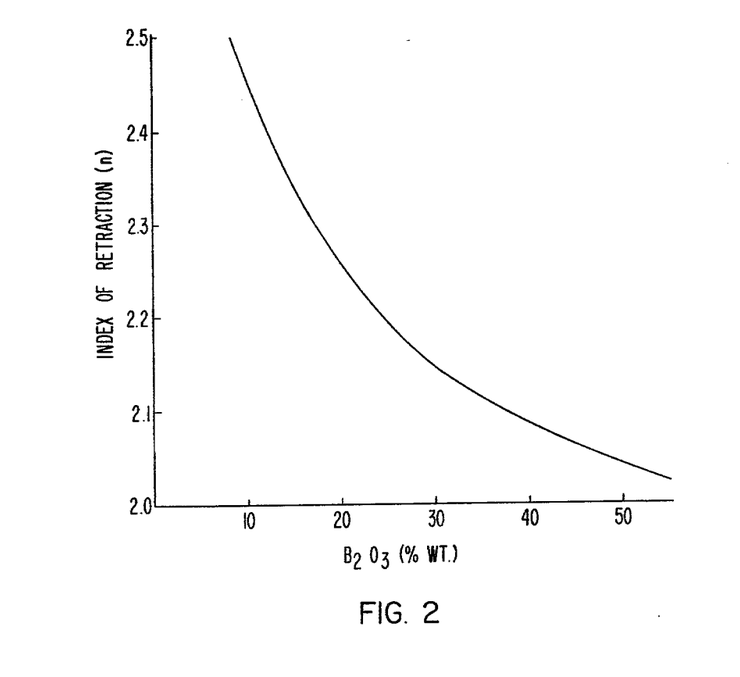
FIGS. 2 to 8 are graphs which illustrate the results of experiments.

For example, a suitable carrier concentration and junction depth is produced for photovoltaic solar application by using N-type silicon (10 to 20 ohms) and diffusing boron from the AR coating at 900° C. in vacuum for about 45 minutes. FIG. 2 shows the index of refraction of the coating at the end of this heat treatment as a function of boron concentration in the $TiO_2$ based AR precursor solution. As can be seen from FIG. 2, for this heat treatment to produce an index close to 2 over 50% $B_2O_3$ must be used in the precursor solution. Even though this is acceptable it is noticed that at high $B_2O_3$ concentration, i.e., over 40%, the coating tends to become cloudy, and chemical and environmental resistence may drop. Thus, a suitable range of dopant concentration is from 1 to 50%. A preferred method of adjusting the index of the coating to 2 is to limit the boron addition to less than 30% and to lower the index by the addition of another constituent of low index such as $SiO_2$. The $SiO_2$ component may also be added from alkoxides or partially hydrolyzed alkoxides similar to dopant introduction and is described in U.S. application Ser. No. 931,346. (The data for FIGS. 2 to 7 was obtained using procedures described in Example 1. Measurements were done by spreading resistance.)

Figure 3:
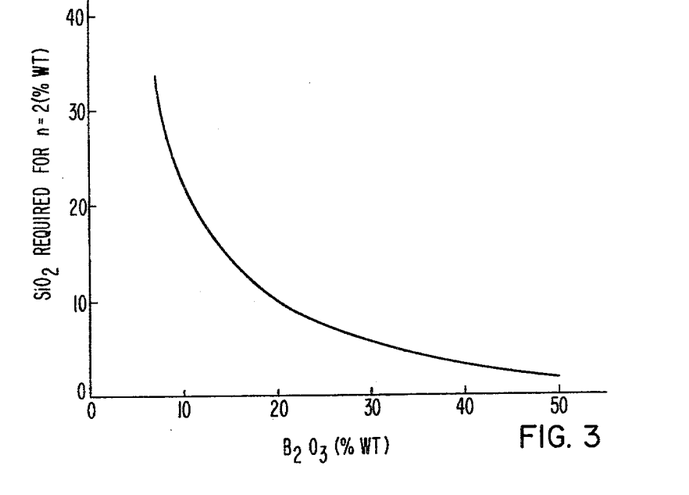

The following table, graphically illustrated in FIG. 3, shows the amount of equivalent $SiO_2$ required to lower the index of refraction to about 2 as a function of amount of $B_2O_3$ dopant present in a titania based AR coating subjected to 900° C. vacuum treatment for 45 minutes.

| $B_2O_3$ (wt%) | $SiO_2$ wt% | $TiO_2$ (wt%) |
|---|---|---|
| 10 | 25 | 65 |
| 20 | 15 | 65 |
| 30 | 10 | 60 |
| 40 | 5 | 55 |
| 50 | 3 | 47 |

Additional information on controlling the index of refraction of the metal oxide coating can be found in application Ser. No. 931,346.

Figure 4:
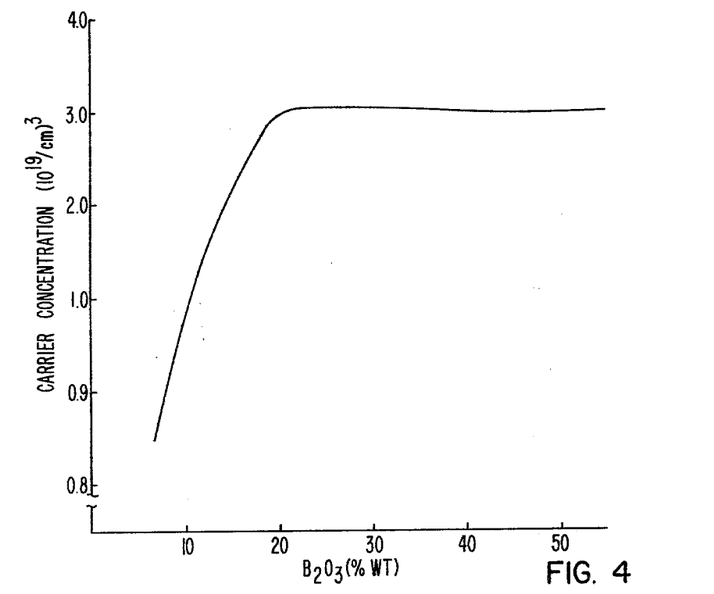
Figure 5:
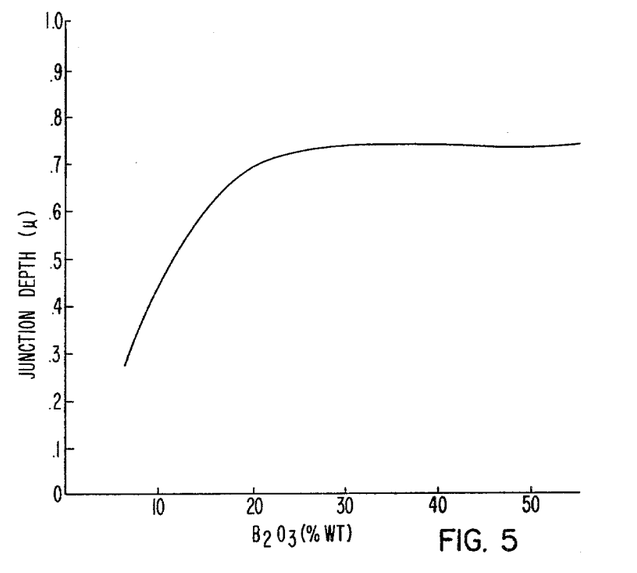
Figure 6:
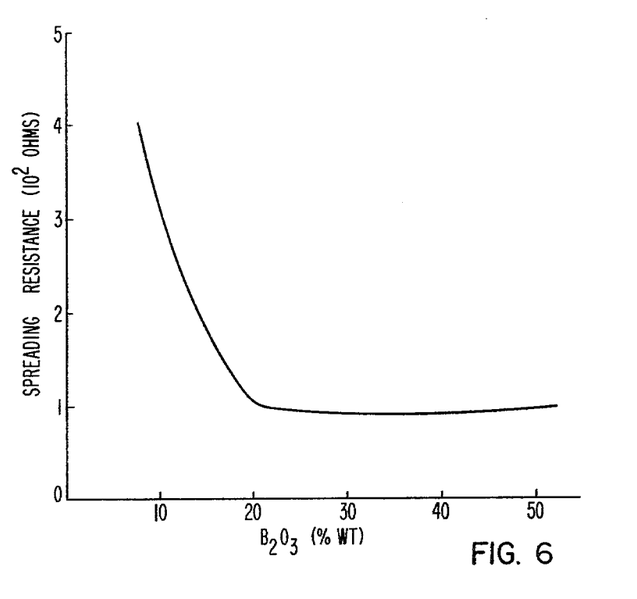

The amount of carrier concentration, spreading resistance, and the junction depth in an N-type silicon substrate (10 ohm resistance) with one hour heat treatment at 900° C. in vacuum as a function of $B_2O_3$ concentration in the AR coating are shown in FIGS. 4, 5, and 6 which illustrate the following table.

| Wt.% $B_2O_3$ in AR Coating | Carrier Concentration per $cm^3$ | Junction Depth ($\mu$) | Spreading Resistance |
|---|---|---|---|
| 10% | $1 \times 10^{19}$ | .40 | $2.6 \times 10^2$ |
| 20% | $3 \times 10^{19}$ | .70 | $0.8 \times 10^2$ |
| 30% | $3 \times 10^{19}$ | .75 | $0.8 \times 10^2$ |
| 40% | $3 \times 10^{19}$ | .75 | |
| 50% | $3 \times 10^{19}$ | .75 | $0.8 \times 10^2$ |

The significance of these figures are, first, that the boron concentration above 20% wt. does not affect the carrier concentration nor the junction depth, unlike the boron diffusion done from conventional glass coatings. Secondly and more importantly, the carrier concentration was stabilized at a value in the $10^{19}/cm^3$ range regardless of the boron present in the AR coating above 20 wt.%. This is significant because this value represents the optimized balance between two conflicting factors—the undesirable recombination effect, and the desirable conductivity with increasing carrier concentration. Due to this property of the coatings of this invention, deeper junctions can be obtained with stable carrier concentrations in the method of this invention.

Figure 7:
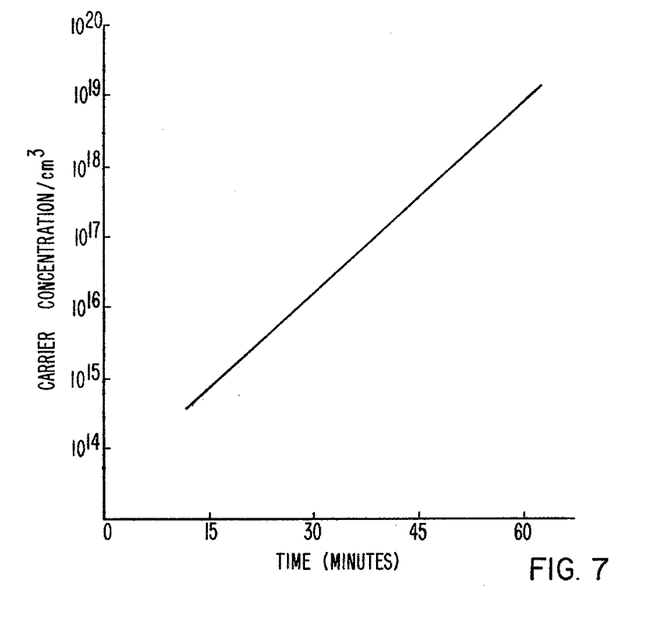

The effect of time on the carrier concentration appears to be linear at 900° C. FIG. 7, which illustrates the data of the following table, shows the effect of bake time on the carrier concentration and the junction depth in N-type silicon (10 ohm resistance) for a 10% $B_2O_3$ doped AR coating at 900° C. in vacuum.

TABLE A

| Time | Carrier Concentration per $cm^3$ | Junction Depth ($\mu$) | Surface Resistance |
|---|---|---|---|
| 15 min. | $7 \times 10^{14}$ | 0.23 | $250 \times 10^2$ |
| 30 min. | $1.5 \times 10^{16}$ | 0.16 | $10 \times 10^2$ |
| 45 min. | $2.3 \times 10^{17}$ | 0.42 | |
| 60 min. | $1.0 \times 10^{19}$ | 0.45 | $2.6 \times 10^2$ |

This shows that the junction depth can precisely be controlled by heat treatment time.

EXAMPLE 1

A 3.5 weight percent equivalent $TiO_2$ containing solution was prepared as follows: 1.5 g $H_2O$, and 130 mg (4 drops) $HNO_3$ acid were added to 90 g of dry ethyl alcohol, $C_2H_5OH$. Then 10 g of $Ti(OC_2H_5)_4$ was also added and mixed. A clear soluton resulted.

Another clear solution containing trimethyl borate in a partially hydrolyzed form, and containing 10 weight percent equivalent boric oxide, was prepared by adding: 2 g water to 23 g of dry ethyl alcohol. To this 10 g of trimethyl borate, $B(OCH_3)_3$, was added and mixed. (When more than 1.5 moles of $H_2O$ is used per mole boron alkoxide a precipitate results).

From these two titania and boron solutions, 10, 20, 30, 40, and 50 weight percent equivalent $B_2O_3$ containing solutions were prepared by simple mixing them in proper proportions.

These solutions were coated on 5 cm silicon wafers by spinning at 2000 rpm. These wafers were then heated at 900° C. for 60 minutes in vacuum. The index of refraction of coatings, carrier concentrations, junction depth, and spreading resistance were then measured, which are shown in the following table.

| Wt. % $B_2O_3$ | Index of Refraction of Coating | Carrier Concentration/$cm^3$ | Junction depth ($\mu$) |
|---|---|---|---|
| 10 | 2.47 | $1 \times 10^{19}$ | 0.40 |
| 20 | 2.26 | $3 \times 10^{19}$ | 0.70 |
| 30 | 2.14 | $3 \times 10^{19}$ | 0.75 |
| 40 | 2.08 | $3 \times 10^{19}$ | 0.75 |
| 50 | 2.04 | $3 \times 10^{19}$ | 0.75 |

EXAMPLE 2

The indices of refraction of the optical coatings made in Example 1 at various amounts of boron dopings can be reduced to 2 to satisfy the Fresnel condition for antireflectivity on silicon.

A 10% of silica-containing solution was prepared by hydrolyzing tetraethylsilicate, $Si(OC_2H_5)_4$, with 1.8 moles of water in ethanol. Using this solution and the boron and titania solutions described in Example 1 the following AR coating solution was prepared: 21 g, 10 wt.% eq $B_2O_3$ containing solution and 10.4 g, 10% eq $SiO_2$ containing solutions were added to 150 g dry ethanol. 1.5 g $H_2O$ and 130 mg (4 drops) $HNO_3$ acid were also introduced. After mixing, 10 g of $Ti(OC_2H_5)_4$ was added and mixed.

This solution contained a total of 5 weight percent equivalent oxide which was made up by 70% $TiO_2$, 20% $B_2O_3$ and 10% $SiO_2$.

This solution was then spin-coated at 1000 rpm on 1½ inches silicon wafers and heat treated at 900° C. in vacuum for 45 minutes.

Figure 8:
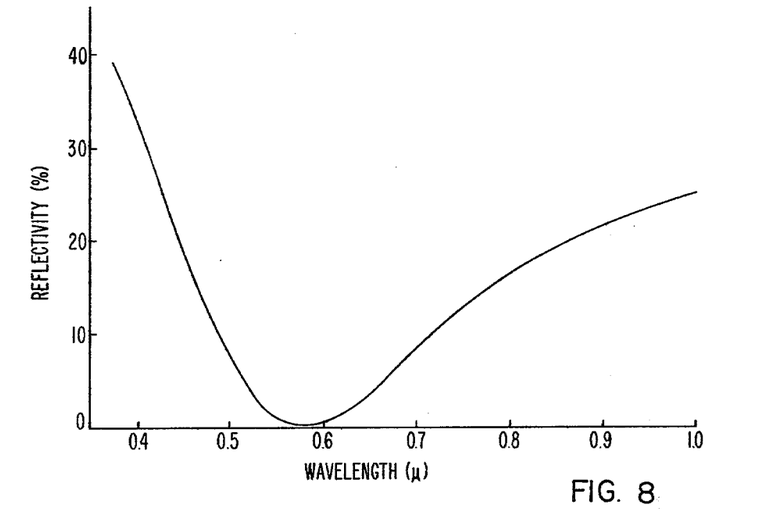

The spectral reflectivity curve measurements were done. FIG. 8 shows the spectral reflectivity of the coating which indicates that an ideal single layer antireflective film on silicon has been produced that meets the index of refraction and thickness requirements.

When the boron diffusion measurements were done, it was found that this sample had a carrier concentration of about $3 \times 10^{19}$ and a junction depth of about $0.5\mu$. Junction depth and carrier concentration was extremely uniform on the entire sample.

EXAMPLE 3

Example 2 was repeated with using unhydrolyzed tetraethyl silicon which reacts with the hydroxyl groups of titania. The results were similar except the viscosity of the solution was different. It required an adjustment on the speed of application to obtain quarterwave optical thickness.

EXAMPLE 4

Example 2 was repeated using unhydrolyzed $B(OCH_3)_3$ which again reacts with the hydroxyl groups of titania. The results were similar, except that due to the slightly different viscosity of the solution, the coating application rate needed to be different, e.g., 800 rpm.

EXAMPLE 5

Example 2 was repeated using titanium butoxide, $Ti(OC_4H_9)_4$ and titanium isopropoxide, $Ti(OC_3H_7)_4$. Also, various other alcohols were used. The results were similar.

EXAMPLE 6

A 10% eg $B_2O_3$ doped titania AR coating solution was prepared as described in Example 2. This solution was applied on N-type silicon wafers of 0.001 ohm per centimeter resistivity at 1000 rpm. The samples were baked at 900° C. in vacuum for various lengths of time. The effect of time on carrier concentration, junction depth, and surface resistance for this composition and heat treatment is shown in Table A and FIG. 7.

EXAMPLE 7

Example 6 was repeated with 20% boron. The junction depth was found to be $0.50\mu$ after baking for 50 minutes and $0.75\mu$ after baking for 60 minutes.

EXAMPLE 8

A 3.5 weight percent $TiO_2$ alkoxide precursor solution was prepared as in Example 1. Phosphoric acid was added to this solution to obtain 15 weight percent equivalent of $P_2O_5$ based on $TiO_2$ concentration. The solution was applied to boron doped silicon wafers having 0.001 ohm per centimeter resistivity. The wafers were spun at 1000 rpm then heat treated at 1050° C. in nitrogen for one hour. An excellent anti-reflective coating resulted. Tests on the product showed that a suitable phosphorus diffusion took place.

EXAMPLE 9

Example 8 was repeated except 10% phosphorus was introduced from a triethyl phosphate solution. The junction was formed at 1000° C. and an excellent antireflective coating with phosphor doping again resulted.

EXAMPLE 10

Tantalum alkoxide was used instead of titanium as the base solution and doped with 10% $B_2O_3$ as in Example 1. Boron diffusion and an antireflective coating resulted.

EXAMPLE 11

A solution containing 5% total oxide which was in part made with 70% $TiO_2$, 20% $B_2O_3$ and 10% $SiO_2$ as described in Example 2 was prepared and spin coated on an N-type 10-12 ohm resistance silicon wafer 100 cm in diameter at 1000 rpm. The samples were baked at 900° C. for 45 minutes and were divided 1 cm² photovoltaic cells. The results of these unoptimized cells are shown in the following table.

In the following table, sample number 4 was faulty in some respect. It is believed that still higher efficiencies which are listed in the next to the last column will be obtained under optimal conditions.

(A) alkoxide having the general formula $M(OR)_n$ where M is selected such that an oxide coating formed from this solution is selected from the group consisting of 40 to 100% $TiO_2$, 0 to 25%, $SiO_2$, and up to 15% of another metal oxide of a metal which forms an alkoxide, and mixtures thereof, R is alkyl from $C_1$ to $C_6$, and n is the valence of M;

(B) about 1.7 to about 8 moles of water per mole of alkoxide;

(C) sufficient alcohol to give a solid content of about 0.1 to about 15%;

(D) a sufficient amount of a suitable acid to prevent cloudiness; and (E) about 1% to about 50% of a dopant compound selected from the group consisting of boron and phosphorus containing compounds.

10. A method of simultaneously doping a silicon chip and forming an oxide coating on its surface comprising:

(A) preparing the clear solution which results from mixing ingredients comprising:

(a) alkoxide having the general formula $M(OR)_n$ where M is selected such thut an oxide coating formed from this solution is selected from the group consisting of 40 to 100% $TiO_2$, 0 to 25% $SiO_2$, and up to 15% of another metal oxide of a metal which forms an alkoxide, and mixtures thereof, R is alkyl from $C_1$ to $C_6$, and n is the valence of M;

(b) about 1.7 to about 8 moles of water per mole of

| Sample | short circuit milliamps | open circuit voltage | peak power point | reverse current | ideality factor | series resistance | fill factor | efficiency | open circuit decay lifetime |
|---|---|---|---|---|---|---|---|---|---|
| Standard | 21.90 | .562 | 19.67 | −6.096 | 2.12 | −1.27 | .737 | 9.60 | .00 |
| 1 | 24.60 | .515 | 22.57 | −7.837 | 1.38 | .60 | .734 | 9.83 | 5.60 |
| 2 | 24.60 | .515 | 22.68 | −8.289 | 1.29 | .76 | .738 | 9.89 | 5.60 |
| 3 | 24.60 | .515 | 22.46 | −7.442 | 1.47 | .45 | .729 | 9.77 | 5.20 |
| 4 | 22.20 | .511 | 16.81 | −3.914 | 3.77 | 1.97 | .503 | 6.03 | .10 |
| 5 | 22.80 | .516 | 20.84 | −7.458 | 1.48 | .32 | .735 | 9.15 | 4.55 |

What we claim is:

1. A method of doping silicon comprising forming a coating on said silicon from an alkoxide solution partially hydrolyzed with water, where at least 40% of said coating is titania, said coating containing a dopant selected from the group consisting of boron and phosphorus, and heating said coated silicon above the diffusion temperature of said dopant, thereby diffusing said dopant into said silicon.

2. A method according to claim 1 wherein said silicon is N-type and said dopant is P type.

3. A method according to claim 2 wherein said dopant is boron.

4. A method according to claim 3 wherein said temperature is about 850° to about 1100° C.

5. A method according to claim 1 wherein said dopant is diffused to a depth greater than 1 micron.

6. A method according to claim 1 wherein said coating on said silicon is greater than 100 square centimeters in area.

7. A method according to claim 1 wherein at least two different coatings containing different dopants are applied to separate well-defined areas of said silicon.

8. A method according to claim 1 wherein said coating is antireflective and said silicon is part of a photovoltaic cell.

9. The clear solution which results from mixing ingredients comprising:

alkoxide;

(c) sufficient alcohol to give a solid content of about 0.1 to about 15%;

(d) a sufficient amount of a suitable acid to prevent cloudiness; and (e) about 1% to about 50% of a P or N dopant compound selected from the group consisting of boron and phosphorus containing compounds;

(B) applying said solution to the surface of said chip; and (C) heating said chip to convert said solution to a solid coating and to diffuse said dopant into said silicon chip.

11. A method according to claim 10 wherein said dopant compound is selected from the group consisting of boron alkoxides, phosphoric alkoxides, phosphoric acid, and boric acid.

12. A method according to claim 10 wherein said silicon chip is N-doped and said dopant compound contains boron, whereby a P/N junction is formed.

13. A method according to claim 12 wherein said heating is at about 850° to about 1100° C. in the absence of oxygen.

14. A coated silicon chip containing a P/N juncture prepared according to the method of claim 12.

15. A coated silicon chip according to claim 14 wherein said coating is about 600 to about 750Å thick and is antireflective.

16. A coated silicon chip according to claim 15 wherein said oxide coating includes $B_2O_3$, $SiO_2$, or mixtures thereof so as to produce an index of refraction of 2.

17. A silicon solar cell having a P/N juncture and an antireflective coating prepared according to the method of claim 12.

18. A method accordng to claim 10 wherein said M ion is about 100% Ti.

19. A method according to claim 10 wherein said dopant compound is introduced from an alcohol solution of a boron alkoxide hydrolyzed with up to about 1.5 moles of water per mole of alkoxide, and said alcohol solution is added to a titania based solution derived from titanium akoxides, water, and acid.

20. A method according to claim 10 wherein excess dopant is used so that the resulting coating has an index of refraction of about 2.

* * * * *